United States Patent
Fukasawa et al.

(10) Patent No.: US 6,638,848 B1
(45) Date of Patent: Oct. 28, 2003

(54) METHOD OF ETCHING INSULATING FILM AND METHOD OF FORMING INTERCONNECTION LAYER

(75) Inventors: Masanaga Fukasawa, Kanagawa (JP); Shingo Kadomura, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/517,731

(22) Filed: Mar. 2, 2000

(30) Foreign Application Priority Data

Mar. 3, 1999 (JP) .......................................... 11-055771

(51) Int. Cl.$^7$ .................. H01L 21/4763; H01L 21/302; H01L 21/461
(52) U.S. Cl. ..................... 438/618; 438/712; 438/723; 438/743; 438/725
(58) Field of Search ................................ 438/723, 738, 438/743, 712, 725, 618

(56) References Cited

U.S. PATENT DOCUMENTS

| | | | | | |
|---|---|---|---|---|---|
| 4,772,489 A | * | 9/1988 | Shikata | ........................ | 438/779 |
| 5,242,538 A | * | 9/1993 | Hamrah et al. | ................ | 216/66 |
| 5,385,862 A | * | 1/1995 | Moustakas | .................. | 117/108 |
| 5,805,624 A | * | 9/1998 | Yang et al. | .................... | 372/45 |
| 5,904,860 A | * | 5/1999 | Nagakubo et al. | ............. | 216/34 |
| 5,948,161 A | * | 9/1999 | Kizuki | ......................... | 117/89 |
| 5,985,747 A | * | 11/1999 | Taguchi | ...................... | 438/622 |
| 6,008,502 A | * | 12/1999 | Deguchi et al. | .............. | 257/10 |
| 6,045,978 A | * | 4/2000 | Tran et al. | ................... | 430/313 |
| 6,046,088 A | * | 4/2000 | Klein et al. | .................. | 438/296 |
| 6,080,529 A | * | 6/2000 | Ye et al. | ...................... | 430/318 |
| 6,096,592 A | * | 8/2000 | Cho | ............................ | 438/238 |
| 6,171,917 B1 | * | 1/2001 | Sun et al. | .................... | 438/305 |
| 6,265,287 B1 | * | 7/2001 | Tsujimura et al. | .......... | 438/478 |

\* cited by examiner

Primary Examiner—Matthew Smith
Assistant Examiner—Chuong A Luu
(74) Attorney, Agent, or Firm—Rader, Fishman & Grauer PLLC; Ronald P. Kananen

(57) ABSTRACT

A method of rapid etching of an insulating film including an organic-based dielectric film without forming a damage layer or causing decline of the throughput, including the steps of forming an insulating film including an organic-based dielectric film such as a stacked film having a polyarylether film or other organic-based dielectric film and a silicon oxide-based dielectric film or other insulating film, forming a mask layer by patterning above the insulating film, and when etching the organic-based dielectric film portion, using ions or radicals containing NH group generated by gaseous discharge in a mixed gas of hydrogen gas and nitrogen gas or a mixed gas of ammonia gas for etching using the mask layer as an etching mask, to etch the insulating layer and form openings etc. while generating reaction products containing CN group.

5 Claims, 10 Drawing Sheets

METHOD OF ETCHING INSULATING FILM AND METHOD OF FORMING INTERCONNECTION LAYER

BACKGROUND OF THE INVENTION

1. Field of the Invention

The present invention relates to a method of etching an insulating film and a method of forming an interconnection layer, more particularly relates to a method of etching an insulating film including an organic-based dielectric film of a low dielectric constant and a method of forming an interconnection layer which forms openings in the insulating film by etching and buries a conductor there to form the interconnection layer.

2. Description of the Related Art

Recent semiconductor integrated circuits are reaching the next generations of miniaturization and integration in just three years. Integration of more than several million elements on a several mm square semiconductor chip is becoming necessary.

To achieve such miniaturized and integrated semiconductor devices, the design rule has been reduced to 70% of that of the previous generation. For example, the gate length of the gate electrodes of transistors and the area occupied by capacitors in a DRAM etc. have been reduced. Along with this reduction, the semiconductor devices have also been increased in speed.

Along with the increasing miniaturization and integration of semiconductor devices, it is no longer enough to just miniaturize planar elements in a single interconnection layer of the semiconductor device. Technology for multilayer interconnections stacking two or more interconnection layers has become essential.

On the other hand, there is a growing demand for greater functions and faster operating speeds of the elements in the above highly integrated semiconductor devices. For example, in the above miniaturized multilayer interconnection layer, the signal delay due to the increase of the capacity between interconnection layers has become a factor obstructing the increase of the speed of device operation. This is becoming a serious problem.

To solve the problem, the method of forming an interlayer insulating film by an insulating material having a lower dielectric constant than the conventionally used silicon oxide (dielectric constant of 4.3) so as to reduce the capacity between the interconnection layers has been studied.

Insulating materials having a lower dielectric constant than silicon oxide may be roughly divided into organic-based materials and inorganic-based materials.

The leading inorganic-based material, SiOF, has come under attention as a soon to be realized technique since it can be easily formed by, for example, plasma chemical vapor deposition (CVD) method.

On the other hand, as organic-based materials, there are many materials having a low dielectric constant of 2 to 3.0 such as polyarylethers. There are great hopes for their commercial use in the next generation on.

The method of producing a semiconductor device reduced in capacity between interconnection layers by partial use of an organio-based material of a low dielectric constant for the interlayer insulating film as described above is for example as follows.

First, as shown in FIG. 1A, a not shown semiconductor element such as a transistor is formed on a silicon semiconductor substrate 10, then for example aluminum is deposited above the semiconductor substrate 10 or above the not shown insulating film and patterned to form a first interconnection layer 11.

Next, for example, a liquid polyarylether is dropped on the substrate, spread uniformly by spinning the substrate, and then baked and cured to form a first interlayer insulating film 12 composed of the polyarylether. Then, a second interlayer insulating film 13 composed of silicon oxide is formed on the first interlayer insulating film 12.

In this way, the interlayer insulating film 14, that is, a stacked insulating layer comprised of the first interlayer insulating film 12 and the second interlayer insulating film 13, is formed.

Next, a resist film R having a pattern of openings of contact holes is formed by photolithography on the interlayer insulating film 14.

Next, for example, as shown in FIG. 1B, etching is performed by a magnetron enhanced reactive etching system using $C_4F_8/CO/Ar/O_2$ as an etching gas to form contact holes CH penetrating through the second interlayer insulating film 13 and expose the first interlayer insulating film.

Then, for example, as shown in FIG. 2A, etching is performed using an electron cyclotron resonance (ECR) type plasma etching apparatus and using oxygen ($O_2$), which is usually used in etching an insulating film comprised of an organic-based material, so as to form contact holes CH penetrating through the interlayer insulating film 14 comprised by the first interlayer insulating film 12 and the second interlayer insulating film 13 and expose the upper surface of the first interconnection layer 11.

In the above etching, the resist film R comprised by the organic-based material is removed by etching.

Further, the outer layer portion of the inner wall surface of the contact holes CH of the first interlayer insulating film 12 is oxidized by etching using oxygen and a damage layer 12' is formed.

Next, as shown in FIG. 2B, a titanium nitride film or a stacked film of titanium nitride and titanium etc. is formed by long distance sputtering of other sputtering to form a bonding layer 15.

Next, for example, the contact holes CH is buried with tungsten or another conductor by a CVD method to form plugs connecting to the first interconnection layer 11, then a second interconnection layer is formed over this so as to connect with the plugs. Next, other semiconductor elements can be formed.

By the above procedures, a semiconductor device with a first interconnection layer and a second interconnection layer respectively formed above and below an interlayer insulating film connected by plugs buried in contact holes penetrating through the interlayer insulating film may be formed.

Summarizing the problems to be solved by the present invention, in the above method of production of a semiconductor device, since a damage layer 12' is formed on the outer surface of the inner wall surface of the contact holes CH of the first interlayer insulating film 12 due to oxidization by the etching using oxygen ($O_2$) in the process of etching the first interlayer insulating film 12 to form the contact holes CH, a gas G ends up being released from the damage layer 12' as shown in FIG. 3 in the process of burying the contact holes CH with tungsten or another conductor by CVD etc. As a result, the contact holes cannot be buried with the tungsten well and voids V are formed. These cause the problem of poor conduction.

To avoid this problem, there is the method of using a nitrogen gas (N$_2$), which has a lower reactivity than oxygen (O$_2$) for etching an insulating film made from an organic-based material. In this case, however, another problem arises that the etching speed becomes remarkably lower compared with the case of using oxygen gas and the throughput in the process of production of the semiconductor device falls.

SUMMARY OF THE INVENTION

An object of the present invention is to provide a method of etching an insulating film enabling high speed etching without causing a decline in the throughput, and without forming a damage layer, the cause of poor conduction, when processing an insulating film including an organic-based dielectric film, and to provide a method of forming an interconnection layer which forms openings in the insulating film by etching and buries them with a conductor to form the interconnection layer.

To attain the above object, according to a first aspect of the present invention, there is provided a method of etching an insulating film including the steps of forming an insulating film containing an organic-based dielectric film on a substrate; forming a mask layer by patterning above the insulating film; and etching the insulating film by ions or radicals at least containing NH group using the mask layer as an etching mask.

Preferably, in the step of etching the insulating film, the etching is performed by generating ions or radicals containing NH group by gaseous discharge in a mixed gas at least containing hydrogen gas and nitrogen gas.

Alternatively, preferably, in the step of etching the insulating film, the etching is performed by generating ions or radicals containing NH group by gaseous discharge in a mixed gas at least containing ammonia gas.

Preferably, in the step of etching the insulating film, reaction products at least containing CN group are generated during the etching.

Preferably, the step of forming the insulating film includes a step of forming an organic-based dielectric film on the substrate and a step of forming a silicon oxide-based dielectric film above the organic-based dielectric film, and, in the step of etching the insulating film, the etching is performed by ions or radicals at least containing NH group on the organic-based dielectric film portion.

Preferably, a polyarylether film is formed as the organic-based dielectric film.

That is, the above method of etching an insulating film of the first aspect of the present invention forms on a substrate an insulating film including an organic-based dielectric film, such as a stacked film comprised of a polyarylether film or other organic-based dielectric film and a silicon oxide-based dielectric film and forms a resist film or other mask layer above the insulating film by patterning. Next, when etching the organic-based dielectric film portion, it uses the ions or radicals including NH group generated by gaseous discharge in a mixed gas of hydrogen gas and nitrogen gas or in a gas containing ammonia gas for etching the insulating film using the mask layer as an etching mask and while generating reaction products containing CN group.

According to the above method of etching an insulating film of the present invention, when etching the polyarylether film or other organic-based dielectric film portion, the etching is performed using tons or radicals at least containing NH group.

By etching using ions and radicals containing NH group, no damage layer causing poor conduction is formed, side etching is suppressed, a high etching speed is maintained without causing a decline in the throughput, and therefore quick etching of an insulating film including an organio-based dielectric film can be achieved.

According to a second aspect of the present invention, there is provided a method of forming an interconnection layer including the steps of forming a first interconnection layer on a substrate; forming an insulating film containing an organic-based dielectric film above the first interconnection layer; forming a mask layer by patterning above the insulating film; etching the insulating film by ions or radicals at least containing NH group using the mask layer as an etching mask to form an opening penetrating through the insulating film and reaching the first interconnection layer; and burying the opening with a conductor to connect with the first interconnection layer and forming a second interconnection layer.

Preferably, in the step of forming the opening, the etching is performed by generating ions or radicals containing NH group by gaseous discharge in a mixed gas at least containing hydrogen gas and nitrogen gas.

Alternatively, preferably, in the step of forming the opening, the etching is performed by generating ions or radicals containing NH group by gaseous discharge in a mixed gas at least containing ammonia gas.

Preferably, in the step of forming the opening, reaction products at least containing CN group are generated while etching.

Preferably, the step of forming the insulating film includes a step of forming an organic-based dielectric film on a substrate and a step of forming a silicon oxide-based dielectric film above the organic dielectric film; and, in the step of forming the opening, the etching is performed by ions or radicals at least containing NH group on the organic-based dielectric film portion.

Preferably, a polyarylether film is formed as the organic-based dielectric film.

That is, the above method of forming an interconnection layer forms a first interconnection layer on a substrate, forms an insulating film including an organic-based dielectric film, such as a stacked film comprised of a polyarylether film or other organic-based dielectric film and a silicon oxide-based dielectric film over the first interconnection layer, and forms a resist layer or other mask layer above the insulating film by patterning. Next, it uses the tons or radicals including NH group generated by plasma discharge in a mixed gas of hydrogen gas and nitrogen gas or in a gas containing ammonia gas for etching the insulating film using the mask layer as an etching mask to form openings penetrating through the insulating film and reaching the first interconnection layer and while generating reaction products containing CN group. Next, it buries the insides of the openings with a conductor to connect to the first interconnection layer and forms a second interconnection layer.

According to the above method of forming an interconnection layer of the present invention, when etching an organic-based dielectric film portion, such as polyarylether film, the etching is performed by ions or radicals including at least NH group.

By etching using ions and radicals containing NH group, no damage layer causing poor conduction is formed, side etching is suppressed, a high etching speed is maintained without causing a decline in the throughput, and therefore quick etching of an insulating film including an organic-based dielectric film for formation of openings and burying with a conductor to form an interconnection layer can be achieved.

BRIEF DESCRIPTION OF THE DRAWINGS

These and other objects and features of the present invention will become clearer from the following description of the preferred embodiments given with reference to the accompanying drawings, in which:

FIGS. 1A and 1B are sectional views of steps of a method of forming an interconnection layer according to the related art, wherein FIG. 1A shows the state up to forming a resist film and FIG. 1B shows the state up to etching of a first interlayer insulating film;

FIGS. 2A and 2B are views of steps following those in FIGS. 1A and 1B, wherein FIG. 2A shows the state up to etching a second interlayer insulating film and FIG. 2B shows the state up to forming a bonding layer;

FIGS. 5A and 5B are sectional views of steps of a method of forming an interconnection layer according to an embodiment of the present invention, wherein FIG. 5A shows the state up to forming a resist film and FIG. 5B shows the state up to etching of a first interlayer insulating film;

FIGS. 6A and 6B are views of the steps following those in FIGS. 5A and 5B, wherein FIG. 6A shows the state up to etching of a second interlayer insulating film and FIG. 6B shows the state up to forming a bonding layer;

FIGS. 7A and 7B are views of the steps following those in FIGS. 6A and 6B, wherein FIG. 7A shows the state up to forming a plug use layer and FIG. 7B shows the state up to removing the plug use layer and the bonding layer outside the contact hole;

FIGS. 8A, 8B, and 8C are views of emission spectra measured in Example 1, wherein FIG. 8A is the emission spectrum when $N_2$=100 sccm, FIG. 8B is the emission spectrum when $N_2/H_2$=50/50 sccm, and FIG. 8C is the emission spectrum when $H_2$=100 sccm;

FIGS. 10A and 10B are views of mass spectra measured in Example 3, wherein FIG. 10A is a mass spectrum during etching using $N_2$ and FIG. 10B is a mass spectrum during etching using $H_2/N_2$.

DESCRIPTION OF THE PREFERRED EMBODIMENTS

Below, preferred embodiments will be described with reference to the accompanying drawings.

The method of forming an interconnection layer according to a preferred embodiment of the invention will be explained first with reference to the drawings.

Figure 1A:
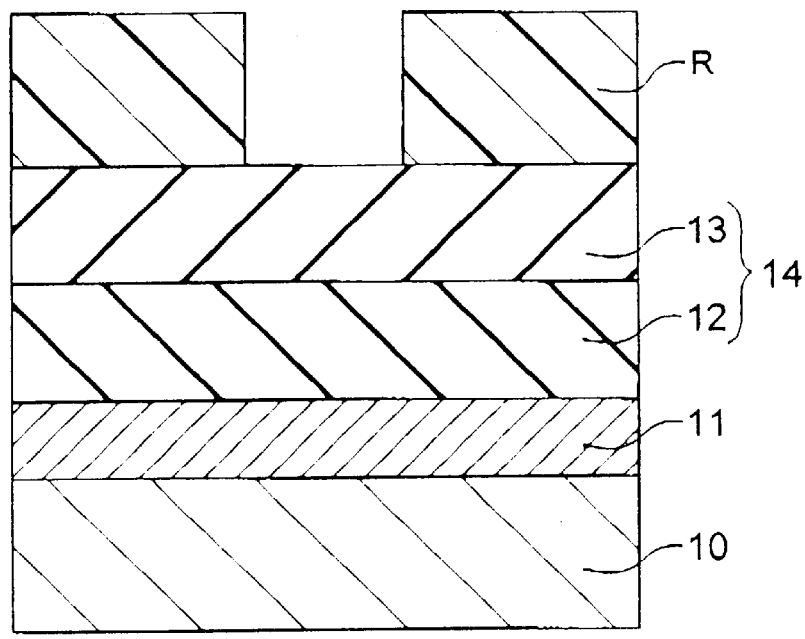
Figure 1B:
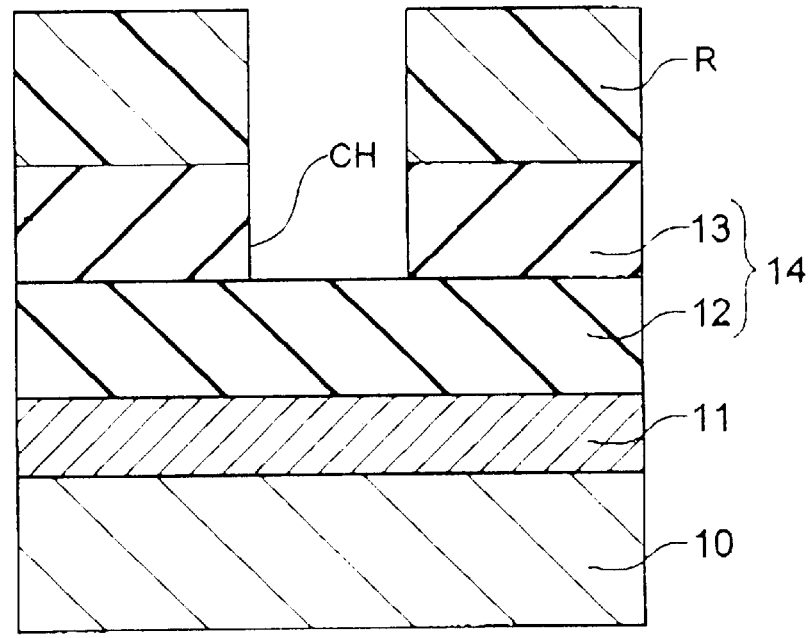
Figure 2A:
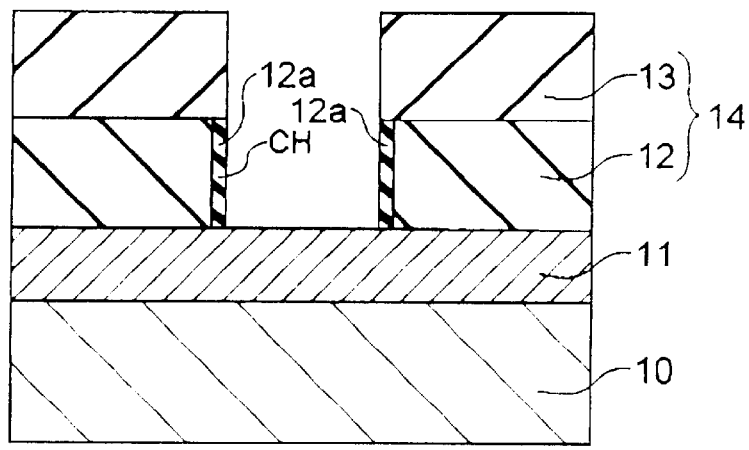
Figure 2B:
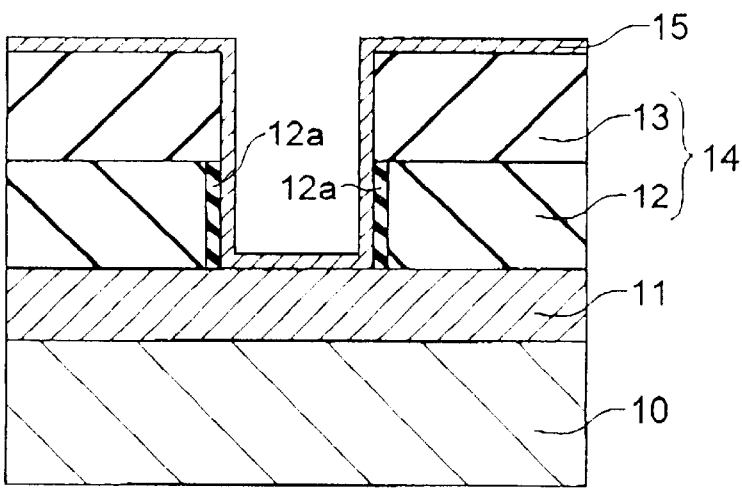
Figure 3:
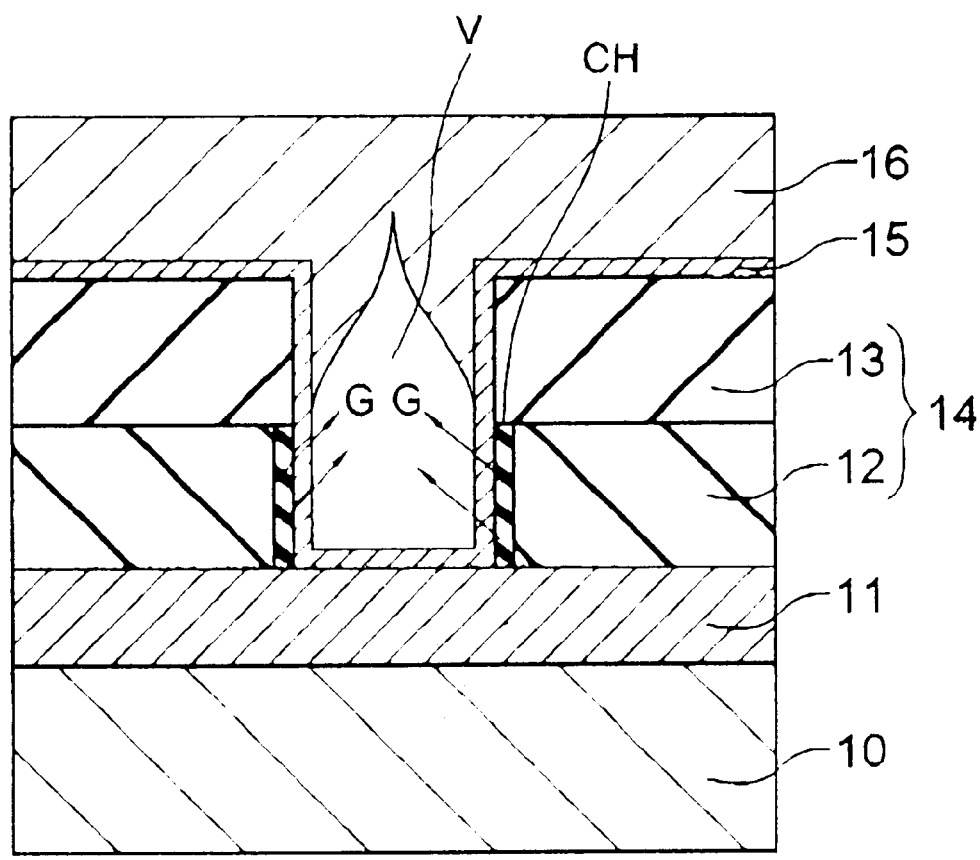
FIG. 3 is a sectional view for explaining the problem in forming a plug layer after FIGS. 2A and 2B.
Figure 4:
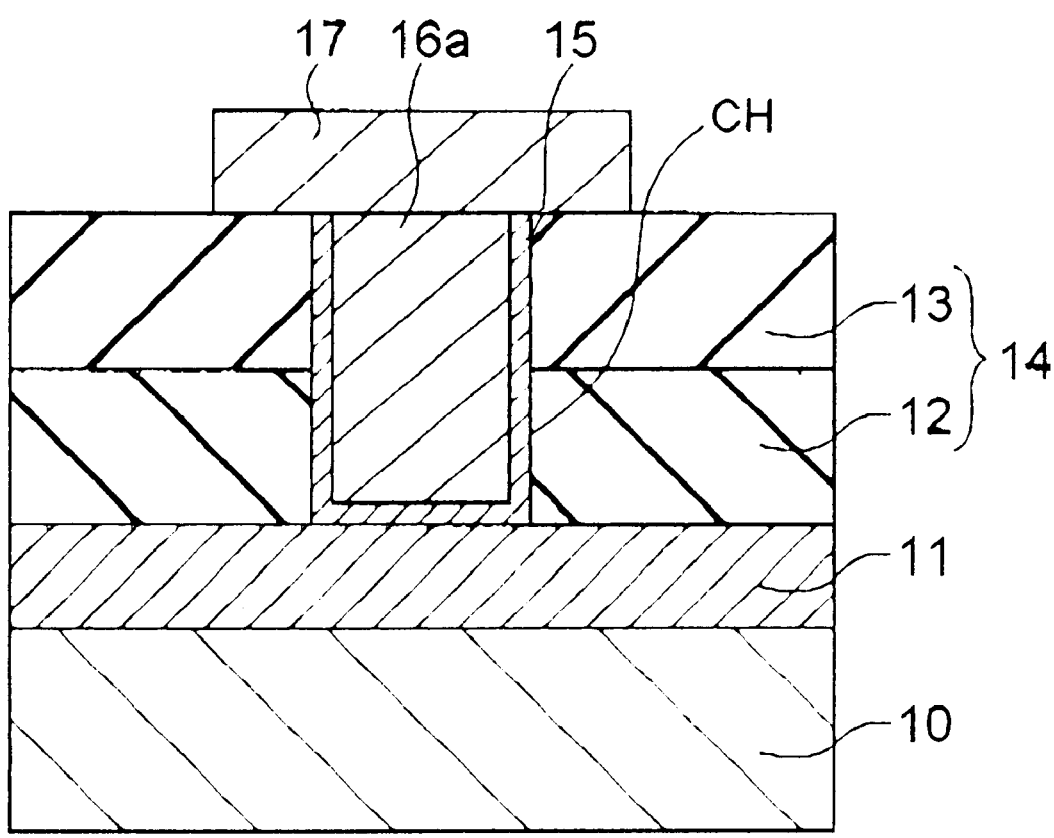
FIG. 4 is a sectional view of an interconnection layer formed by a method of forming an interconnection layer of an embodiment of the present invention.

FIG. 4 is a sectional view of an interconnection layer formed by a method of formation according to the present embodiment.

A transistor or other not shown semiconductor element is formed in a predetermined region of a silicon semiconductor substrate 10. On the other hand, a first interconnection layer 11 comprised of for example aluminum is formed above the semiconductor substrate 10 or above a not shown insulating film in the region shown in FIG. 4.

Above the first interconnection layer, a stacked insulating film comprised of a first interlayer insulating film made of for example polyarylether and a second interlayer insulating film 13 made of silicon oxide, that is, an interlayer insulating film 14, is formed.

The interlayer insulating film 14 is formed with a contact hole CH reaching the first interconnection layer 11. The inside wall of the contact hole CH is covered with a bonding layer 15 comprised of a titanium nitride film or a stacked film of titanium nitride and titanium etc. A plug 16a comprised of for example tungsten is buried in the hole. A second interconnection layer 17 comprised for example by aluminum is formed above the plug 16a connecting to this.

Next, the method of forming the above interconnection layer will be explained.

Figure 5A:
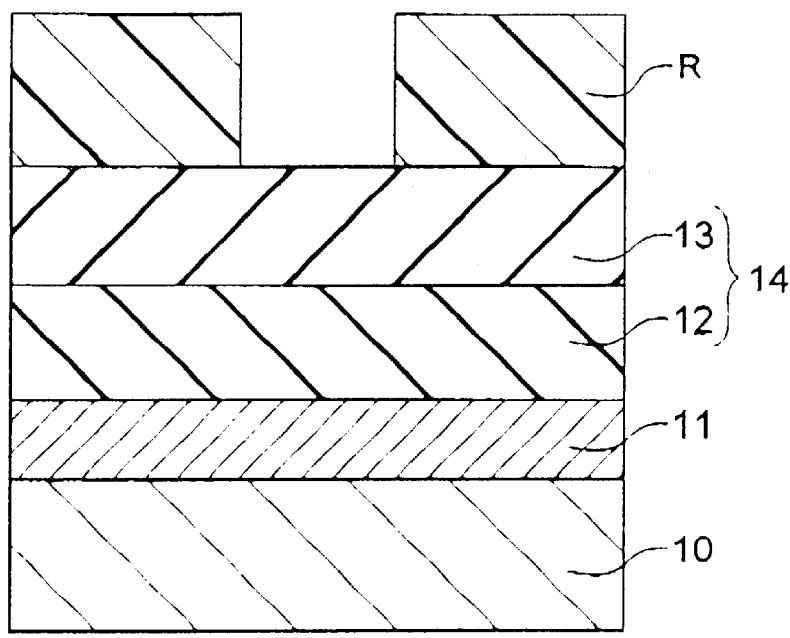

First, as shown in FIG. 5A, a transistor or other not shown semiconductor element is formed in a not shown region above the silicon semiconductor substrate 10, then for example aluminum is deposited above the semiconductor substrate or above a not shown insulating film and patterned to form a first interconnection layer 11.

Next, for example, liquid polyarylether is dropped on the substrate, spread uniformly by spinning the substrate at 2500 to 3000 rpm, baked in a nitrogen atmosphere for example at 150° C. for one minute, then at 250° C. for one minute, then cured in a curing oven under a nitrogen atmosphere at 400° C. for one hour, to form a first interlayer insulating film 12 comprised of the polyarylether to a thickness of 500 nm covering the entire first interconnection layer 11.

Next, a second interlayer insulating film 13 comprised of silicon oxide is formed to a thickness of 600 nm by, for example, plasma CVD method above the first interlayer insulating film 12. The conditions of the plasma CVD process are, for example, an RF power at 13.56 MHZ of 0.5 kW, a pressure of 5 Torr, and a material gas and a flow rate of $SiH_4/N_2O$=100/400 sccm.

In this way, a stacked insulating layer comprised of the first interlayer insulating film 12 and the second interlayer insulating film 13, that is, the interlayer insulating film 14, is formed.

Next, a resist film R forming an etching mask having an opening pattern of contact holes Is formed by photolithography above the interlayer insulating film 14 to a thickness of 850 nm.

Figure 5B:
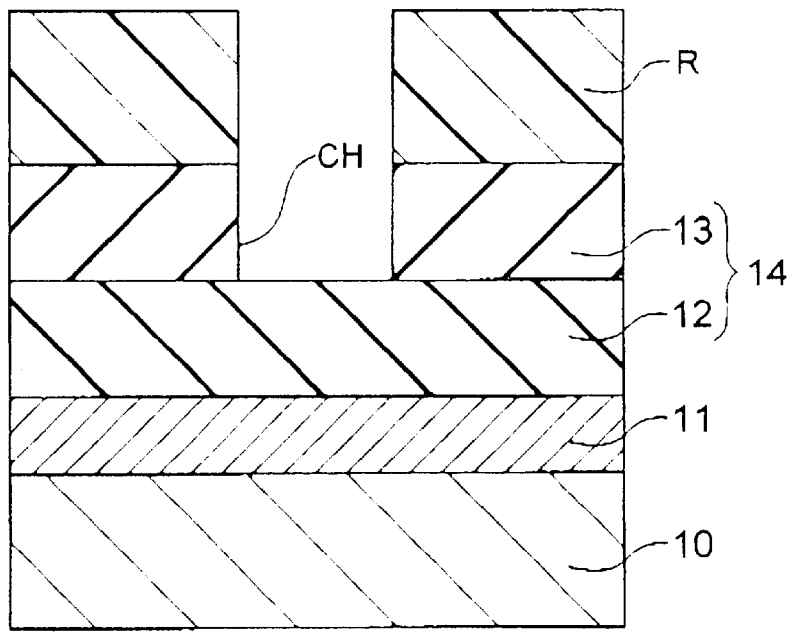

Then, as shown in FIG. 5B, a magnetron enhanced reactive ion etching system Is used for etching under conditions of, for example, a substrate electrode temperature of 20° C., a power source of 1600 W, a pressure of 5.3 Pa, and an etching gas and flow rate of $C_4F_8/CO/Ar/O_2$=14/250/100/2 scam so as to form an opening penetrating through the second interlayer insulating film 13 to expose the first interlayer insulating film 12.

Figure 6A:
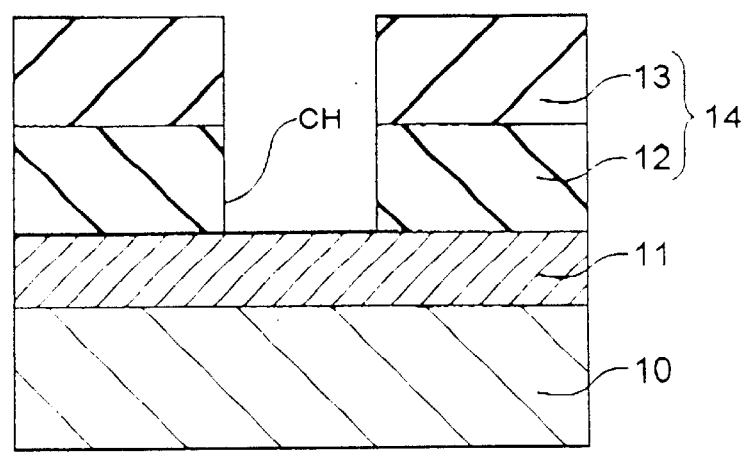

Next, as shown in FIG. 6A, an electron cyclotron resonance (ECR) type plasma etching system is used for etching under conditions of, for example, a substrate electrode temperature of 20° C., a microwave power at 2.45 GHz of 2000 W, a pressure of 0.8 Pa, an RF power of 300 W, and an etching gas and flow rate of $NH_3$=100 sccm to form a contact hole (opening portion) CH penetrating through the insulating film 14 comprised of the first interlayer insulating film 12 and the second interlayer insulating film 13 to expose the upper surface of the first interconnection layer 11.

In the above etching, the resist film R comprised of an organic-based material is removed by etching.

In the above etching, ions or radicals containing NH group are generated by gaseous discharge in a gas containing ammonia gas. These are made to act on the substrate as an etchant for the etching.

Following the same procedure as above except for using as the etching gas, for example, a mixed gas of hydrogen and nitrogen (flow rate of $H_2+N_2=100$ sccm, for example, $H_2/N_2=75/25$ sccm), ions or radicals containing NH group are generated by gaseous discharge in a gas containing a mixed gas of hydrogen and nitrogen. These are made to act on the substrate as an etchant for the etching.

In the above etching, the etching is performed while generating reaction products including CN group for example.

Figure 6B:
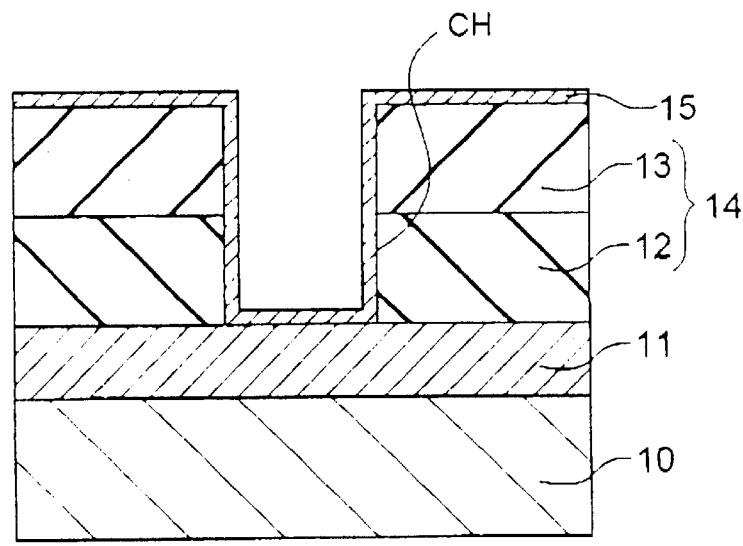

Next, as shown in FIG. 6B, a titanium nitride film or a stacked film of titanium nitride and titanium is formed by for example a sputtering method (long distance sputtering or an ionization sputtering) covering the inside wall of the contact hole CH to form the bonding layer 15.

Figure 7A:
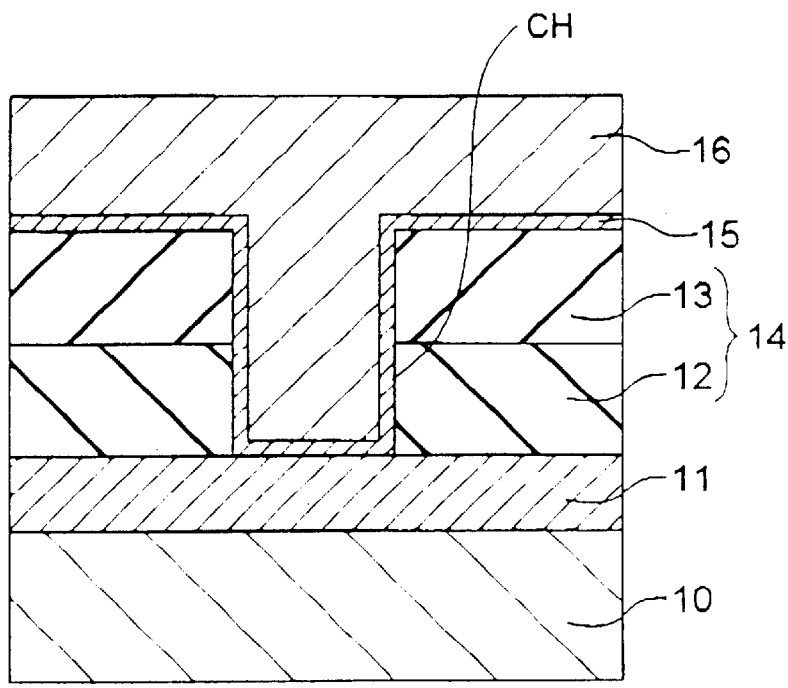

Then, as shown in FIG. 7A, the contact hole CH is buried with tungsten by for example CVD to form the plug use layer 16. Here, the material gas and flow rate in the CVD of the tungsten are, for example. $WF_6/H_2/SiH_4/Ar=30/10\ 00/10/2500$ sccm at the stage of forming the core and $WF_6/H_2/Ar=75/500/2500$ sccm at the burying stage.

As the material of the plug layer, use may be made for example of copper which is a metal material having a low resistance. In this case, it is preferable to use tantalum nitride as a bonding layer.

Figure 7B:
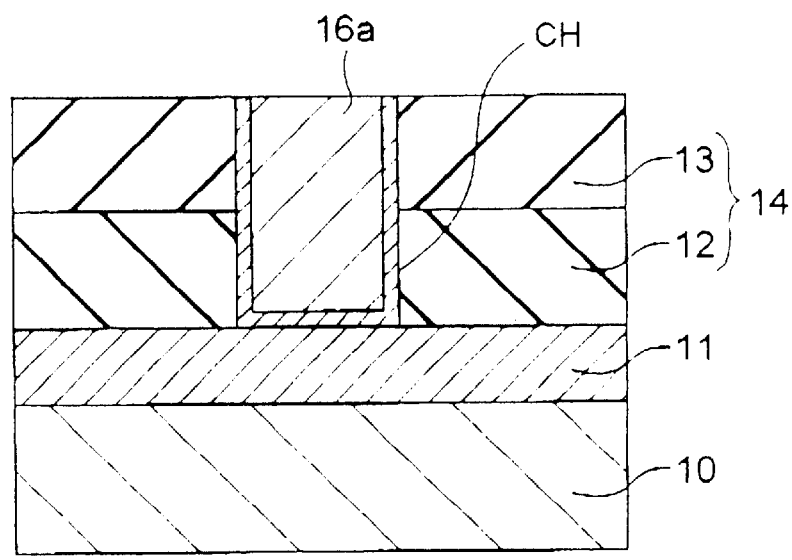

Next, as shown in FIG. 7B, the plug use layer 16 and the bonding layer outside the contact hole CH are etched back by RIE or other etching or processed by chemical mechanical polishing (CMP) etc. to be removed and thereby the plug 16a buried in the contact hole CH is formed.

Next, the second interconnection layer 17 is formed by patterning by aluminum etc. connected to the plug 16a.

By the above, it is possible to form an interconnection layer where, as shown in FIG. 4, the first interconnection layer 11 and the second interconnection layer 17 are connected by the plug 16a burled in the contact hole CH.

According to the method of forming an interconnection layer of the present embodiment, etching is performed by ions or radicals at least containing NH group when etching a polyarylether film or other organic-based dielectric film portion.

By etching by ions or radicals containing NH group, it is possible to anisotropically etch an insulating film including an organic-based dielectric film quickly while maintaining a high etching speed of about 450 nm/min, without causing a decline in the throughput, without forming a damage layer, which is a cause of poor conduction, and while suppressing side etching. It is possible to use this etching to form openings in the insulating film, bury these by a conductor, and thereby form an interconnection layer.

EXAMPLE 1

The emission spectra obtained from the light emitted from the etching gas in the cases of (1) $N_2=100$ sccm, (b) $N_2/H_2=50/50$ sccm, and (a) $H_2=100$ sccm in the etching when etching the second interlayer insulating film comprised of polyarylether in the above embodiment were measured. The results are shown in FIG. 8.

Figure 8A:
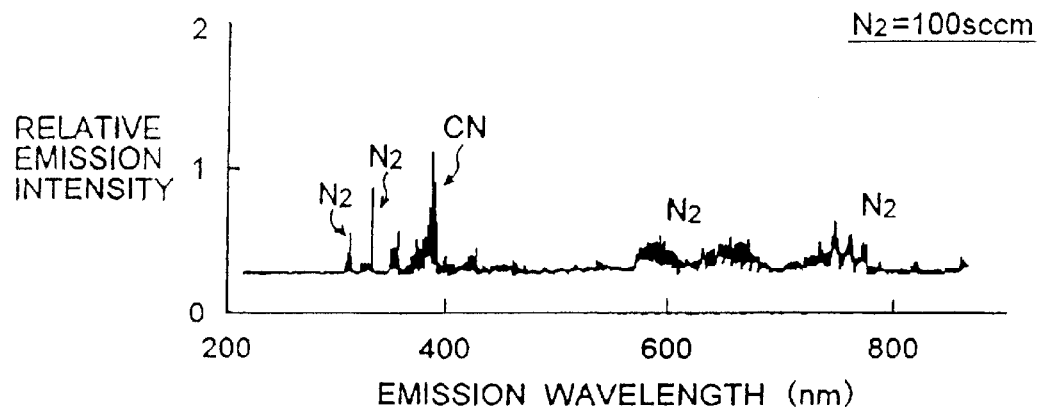
Figure 8B:
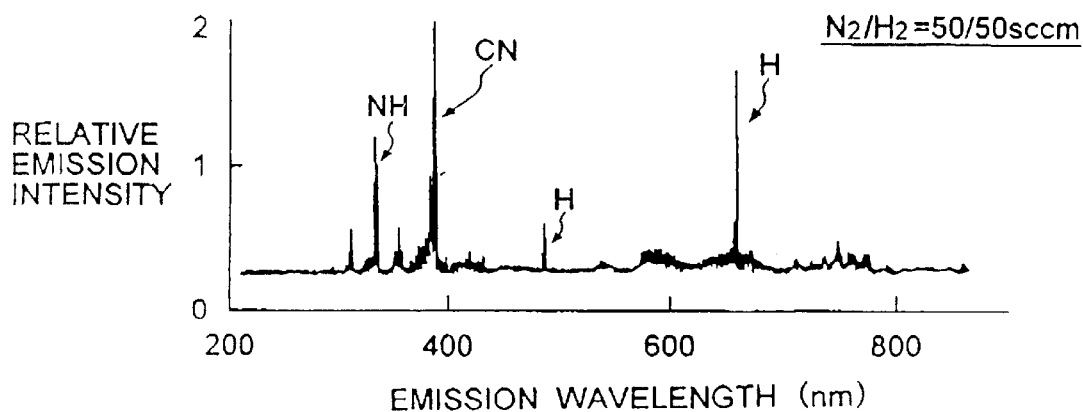
Figure 8C:
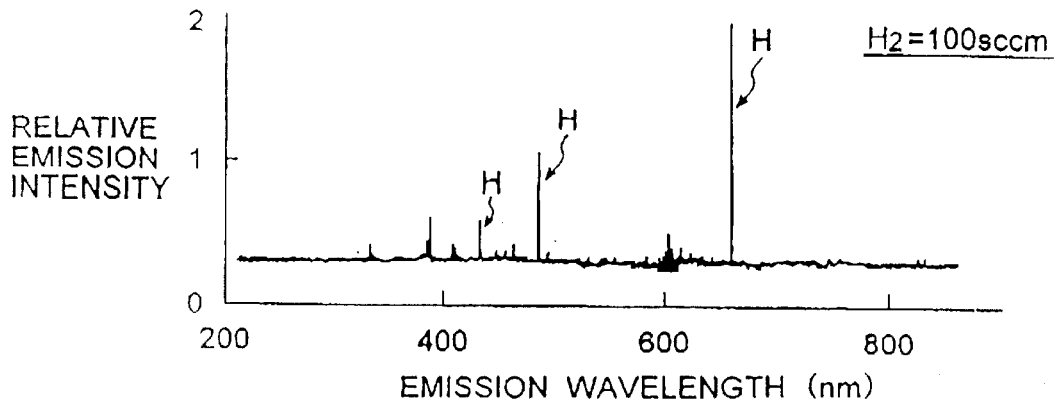

As shown in FIG. 8, when etching by a $N_2/H_2$ mixed gas, a peak of NH not seen when using a $N_2$ gas or $H_2$ gas is observed. Also, the peak of CN was observed stronger in the case of the $N_2/H_2$ mixed gas than the cases of $N_2$ gas or $H_2$ gas.

EXAMPLE 2

The relative etching speed (assuming the etching speed when $N_2/H_2=100/0$ sccm as "1") when changing the ratio of etching gas flow rates from $N_2/H_2=100/0$ to 50/50 to 0/100 sccm and the ratios of intensity of the emission spectra of the light emitting components of CN, NH, $N_2$, CH and H at different ratios of flow rates in the etching when etching the second interlayer insulating film comprised of polyarylether in the above embodiment were measured. The results are <shown in FIG. 9.

Figure 9:
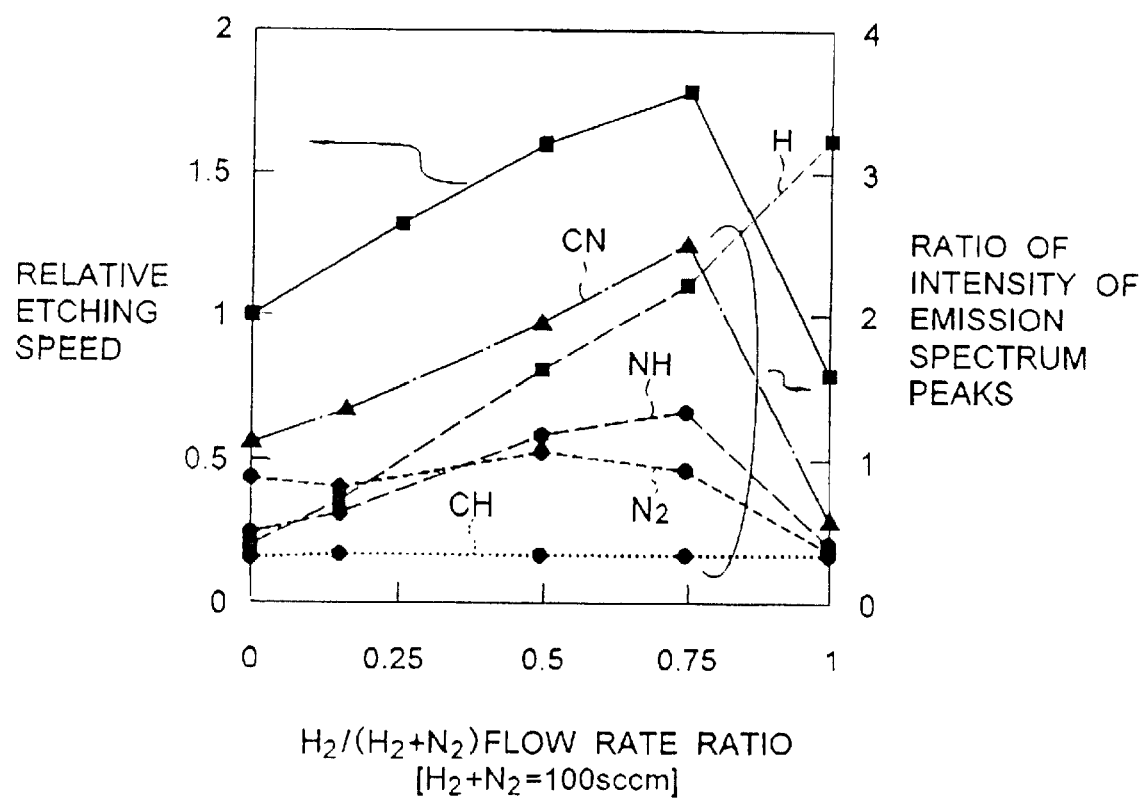
FIG. 9 is a view of the relative etching speed when changing the ratio of flow rates of the etching gas measured in Example 2 and the ratios of intensity of emission spectra of the respective light emitting components of CN, NH, $N_2$, CH, H at different ratios of flow rates.

As shown in FIG. 9, substantially the same behavior is exhibited by the etching speed and the ratio of intensity of emission spectra of CN and NH.

From the experiments of the above Examples 1 and 2, it was confirmed that when etching the second interlayer insulating film comprised of polyarylether, the ions or radicals containing NH group act as an etchant and that a compound containing CN group is produced as a reaction product.

EXAMPLE 3

The mass spectra during etching in the cases of using (a) $N_2$ and (b) $N_2/H_2$ as the etching gas when etching the second interlayer insulating film comprised of polyarylether in the above embodiment were measured. The results are shown in FIG. 10.

Figure 10A:
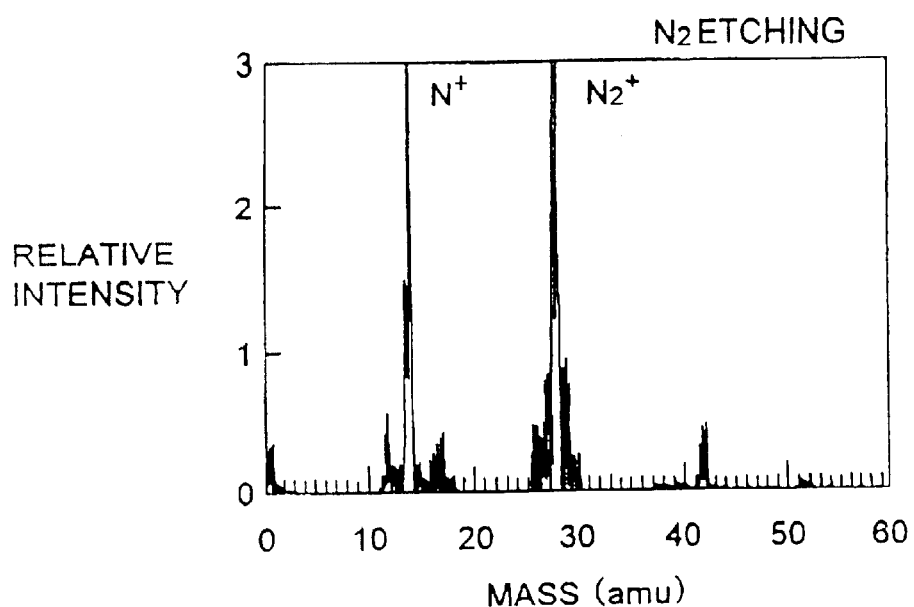
Figure 10B:
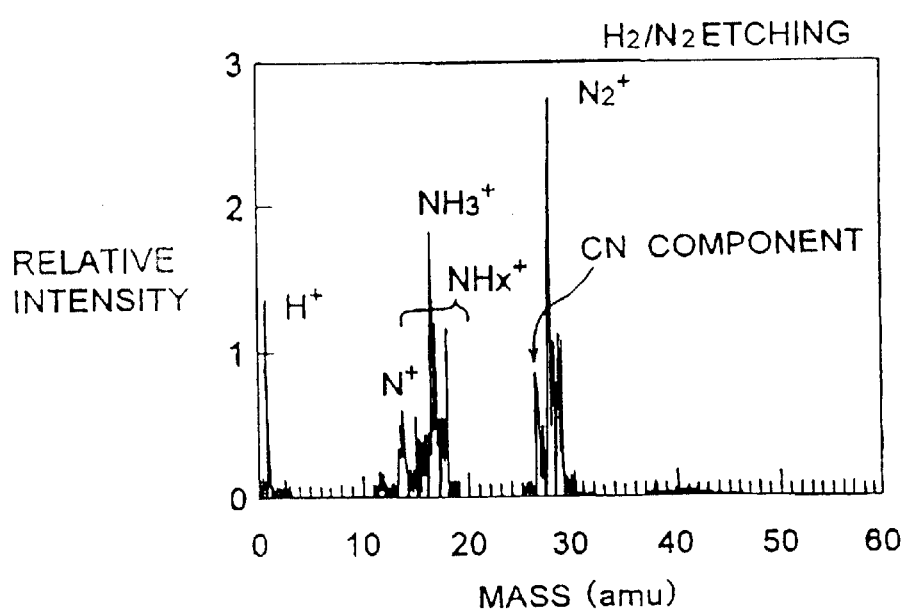

As shown in FIG. 10, when etching using a $N_2/H_2$ gas, it was confirmed that NHx ions and radicals are generated, these contribute to the etching as etchants, and CN or molecules containing CN are generated as reaction products.

The present invention can be applied to a method of producing a semiconductor device including a method of etching an insulating film or a method of forming an interconnection layer etc. It may be applied to any semiconductor device so far as it is formed by a method including a method of etching an insulating film or a method of forming an interconnection layer, such as a DRAM or other MOS transistor semiconductor device, a bipolar-type semiconductor device, or an A/D converter and is not limited.

The present invention is not limited to the above embodiments.

For example, other than etching an insulating film including an organic-based dielectric film to form a contact hole, the present invention can also be applied to the damascene process for forming groove interconnections or the dual damascene process for forming groove interconnections and contact holes simultaneously and other etching processing.

Further, the first interlayer insulating film and the second interlayer insulating film may each have multilayer structures.

The first and second interconnection layers, plugs, and other interconnection layers may each be single-layer in structure or multilayer in structure.

A variety of semiconductor elements such as transistors and capacitors may be formed on the semiconductor substrate.

Other than the above, a variety of modifications can be made within the scope of the present invention.

Summarizing the effects of the invention, according to the present invention, when etching a polyarylether film or other organic-based dielectric film portion, etching is performed by ions or radicals at least containing NH group, therefore it is possible to etch rapidly while maintaining a high etching speed and without causing a decline in the throughput, without forming a damage layer, which causes conductive failures, and while suppressing side etching.

Further, it is possible to form openings in an insulating film including an organic-based dielectric film by etching and bury the openings by a conductor to form an interconnection layer.

While the invention has been described with reference to specific embodiment chosen for purpose of illustration, it should be apparent that numerous modifications could be made thereto by those skilled in the art without departing from the basic concept and scope of the invention.

What is claimed is:

1. A method of etching an insulating film including the steps of:

forming an insulating film containing a polyarylether dielectric film on a substrate;

forming a mask layer by patterning above the insulating film; and etching the insulating film by ions or radicals in an etching gas containing only either ammonia gas, or a mixture of hydrogen gas and nitrogen gas, using an electron cyclotron resonance (ECR) type plasma etching system, and using the mask layer as an etching mask.

2. A method of etching an insulating film as set forth in claim 1, wherein, in the step of etching the insulating film, the etching is performed by generating ions or radicals containing NH group by gaseous discharge in a mixed gas at least containing hydrogen gas and nitrogen gas.

3. A method of etching an insulating film as set forth in claim 1, wherein, in the step of etching the insulating film, the etching is performed by generating ions or radicals containing NH group by gaseous discharge in a mixed gas at least containing ammonia gas.

4. A method of etching an insulating film as set forth in claim 1, wherein, in the step of etching the insulating film, reaction products at least containing CN group are generated during the etching.

5. A method of etching an insulating film as set forth in claim 1, wherein:

the step of forming the insulating film includes a step of forming an organic-based dielectric film on the substrate and a step of forming a silicon oxide-based dielectric film above the organic-based dielectric film, and, in the step of etching the insulating film, the etching is performed by ions or radicals at least containing NH group on the organic-based dielectric film portion.

* * * * *